(12) United States Patent
Takei et al.

(10) Patent No.: US 8,000,364 B2
(45) Date of Patent: Aug. 16, 2011

(54) NITRIDE SEMICONDUCTOR LIGHT EMITTING DEVICE AND METHOD OF MANUFACTURING THE SAME

(75) Inventors: Aki Takei, Sayama (JP); Akihisa Terano, Hachioji (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 12/194,149

(22) Filed: Aug. 19, 2008

(65) Prior Publication Data
US 2009/0207872 A1    Aug. 20, 2009

(30) Foreign Application Priority Data
Feb. 18, 2008  (JP) ................................. 2008-035878

(51) Int. Cl.
*H01S 5/00*    (2006.01)
(52) U.S. Cl. ................................... 372/44.01
(58) Field of Classification Search ............... 372/44.01
See application file for complete search history.

(56) References Cited

U.S. PATENT DOCUMENTS
5,563,422 A    10/1996  Nakamura et al.
2004/0245540 A1*  12/2004  Hata et al. ................. 257/99

FOREIGN PATENT DOCUMENTS
| JP | 07-045867 A | | 2/1995 |
| JP | 2004-221493 A | | 8/2004 |
| JP | 2004221493 A | * | 8/2004 |
| JP | 2006-059933 A | | 3/2006 |

* cited by examiner

*Primary Examiner* — Minsun Harvey
*Assistant Examiner* — Patrick Stafford
(74) *Attorney, Agent, or Firm* — Miles & Stockbridge P.C.

(57) ABSTRACT

The present invention provides a nitride semiconductor light emitting device having an n-type ohmic electrode with an Au face excellent in ohmic contacts and in mounting properties, and a method of manufacturing the same. The device uses an n-type ohmic electrode having a laminate structure that is composed of: a first layer containing Al as a main ingredient and having a thickness not greater than 10 nm or not less than 3 nm; a second layer containing one or more metals selected from Mo and Nb, so as to suppress the upward diffusion of Al; a third layer containing one or more metals selected from Ti and Pt, to suppress the downward diffusion of Al; and a fourth layer being made of Au, from the side in contact with an n-type nitride substrate in order of mention, and after the laminate structure is formed, the n-type ohmic electrode is annealed.

18 Claims, 9 Drawing Sheets

UNEVEN AREA

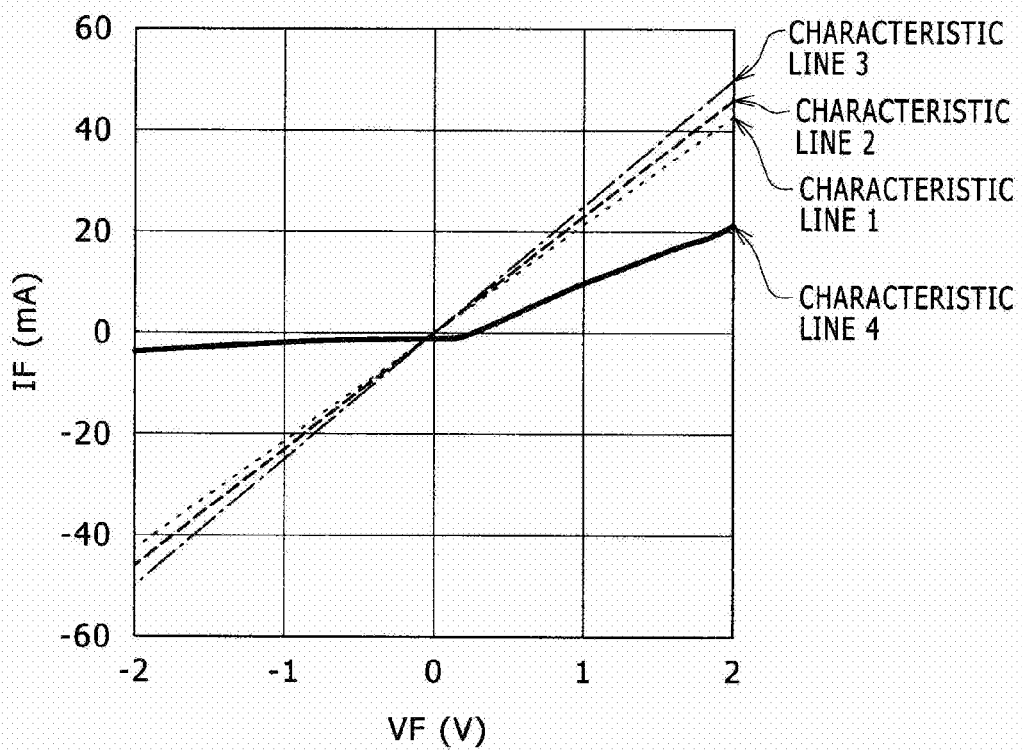

NITRIDE SEMICONDUCTOR LIGHT EMITTING DEVICE AND METHOD OF MANUFACTURING THE SAME

CLAIM OF PRIORITY

The present application claims priority from Japanese Patent Application No. JP2008-035878 filed on Feb. 18, 2008, the content of which is hereby incorporated by reference into this application.

BACKGROUND OF THE INVENTION

1. Field of the Invention

The present invention relates to a nitride semiconductor light emitting device such as light emitting diode (LED), laser diode (LD) or the like that operates in the visible to ultraviolet wavelength region, and a method of manufacturing the same.

2. Description of the Related Arts

Nitride semiconductors represented by gallium nitride (GaN) have been used as a material for light emitting elements capable of generating a light in the edge to ultraviolet region. In general, a light emitting element using a nitride semiconductor is provided with a light emitting layer (typically known as an active layer) having a multiple quantum well structure, and p-type and n-type nitride semiconductor layers for current feeding that are disposed above and below the light emitting layer.

With recent advances in the development of GaN substrate, laser diodes now demonstrate high performance of laser, high quality and high yield, which have been made possible by epitaxially growing a n-type nitride semiconductor layer, a light emitting layer, and a p-type nitride semiconductor layer sequentially on a n-type conductive GaN substrate such that dislocation density or defects within an epilayer can be reduced compared with epitaxial growth on a conventional sapphire substrate and the cleaved end-face of a flat resonator can easily be formed.

Moreover, the introduction of an n-type GaN substrate has shorten the manufacturing process of laser diodes by bringing a change in the structure of them, i.e., forming an n-type ohmic electrode on the rear side of the n-type GaN substrate, not on the exposed surface of an n-type nitride semiconductor layer provided to the core of an epitaxial growth layer by the conventional semiconductor process.

As an example, Japanese Patent Application Publication No. 07-45867 disclosed the primary use of Ti/Al electrode as an ohmic electrode at the bottom of an n-type nitride semiconductor, and explained that desirable ohmic contact with an n-type layer could be obtained by annealing the adhered electrode at high temperature.

However, when an electrode having Al on the uppermost surface undergoes annealing at high temperature, Al is oxidized. Thus, in the mount process for a device, if the electrode having Al on the outermost surface was used, bonding by Au wire or Au-based (e.g., Au—Sn alloy) soldering was not so strong but easily separated. As a result, sufficient junction strength between both sides was hard to obtain.

To resolve the above problem, Japanese Patent Application Publication No. 2006-59933 disclosed an ohmic electrode to be formed on the surface of an n-type nitride semiconductor, the ohmic electrode being provided with, from the near side of the n-type nitride semiconductor, a first layer with thickness of 10 to 70 nm including Al and/or an Al alloy, a second layer with thickness of 10 to 300 nm including one or more metals selected from Pd, Ti, Nb, Mo and W for example, which have higher melting point than that of the first layer (Al, Al alloy) and the third layer (Au), and a third layer with thickness of 100 to 1000 nm including Au, in sequential order. The ohmic electrode was then subjected to annealing at 350 to 600° C. to obtain desirable ohmic property to the n-type nitride semiconductor as well as a smooth and lustrous surface and desirable wire bonding property.

In particular, according to Japanese Patent Application Publication No. 2006-59933, it is important that Pd with thickness of 50 nm is used as metal for the second layer, the ohmic property is checked on using, as a parameter, the thickness of a metal film containing Al of the first layer as a main ingredient, and the first layer film thickness is limited to a range of 10 nm to 70 nm so as to reduce contact resistance.

Further, it described that the relationship between the film thickness of the first layer metal and the contact resistance remained the same when the second layer was made of Pd metal and when the second layer was made of one of Ti, Nb, Mo and W, instead of Pd.

As yet another example, Japanese Patent Application Publication No. 2004-221493 disclosed an electrode to be laminated on the surface of an n-type nitride semiconductor layer, the electrode being provided with, from the bottom, an Ti layer (e.g., 30 nm), an Al layer (e.g., 150 nm), a Mo layer (e.g., 30 nm), a Pt layer (e.g., 15 nm), and a Au layer (e.g., 200 nm) in sequential order, such that delamination of the Au layer is suppressed and diffusion of the Au layer into the semiconductor layer side can be nearly completely suppressed.

SUMMARY OF THE INVENTION

Based on the kinds of metals used for the diffusion barrier layer described in Japanese Patent Application Publication Nos. 2006-59933 and 2004-221493, the inventors formed an electrode having a five-layer laminate structure on an n-type nitride semiconductor layer, which is provided with an Al layer as the first layer with thickness of 100 nm, a diffusion barrier layer having a three-layer structure composed of a Mo layer with thickness of 50 nm, a Ti layer with thickness of 100 nm and a Pt layer with thickness of 50 nm, and lastly a Au layer with thickness of 300 nm in sequential order. The electrode then went though an annealing process at 500° C. under nitrogen atmosphere. It turned out that, as shown in FIG. 2, the electrode surface had a severely rugged or uneven area accompanied by discoloration.

The surface area was analyzed with the application of Auger electron spectroscopy, the analysis result of which is shown in FIG. 3. From the drawing of the uneven surface area, the inventors identified Al, which was supposed to be at the undermost layer of the electrode, on the uppermost layer of the electrode instead and observed the presence of oxygen in addition to Al there, which implies that oxidized Al was formed on the uppermost layer of the electrode.

In effect, the uneven surface area was also found even when only the Al film of the first layer was made thinner to about 30 nm, and the uneven, discolored area has expanded in size if annealing temperature was raised.

As noted before, if an oxidized Al area is created on the electrode surface, sufficient junction strength cannot be obtained between the electrode surface and Au wire or soldering material during the mount process. This can actually be a serious problem when mounting a device.

From the facts mentioned above, one may assume that if Al metal essential for acquiring ohmic property exists in the uppermost Au layer of an electrode, it is difficult to completely suppress the diffusion of Al caused by high-temperature annealing process, no matter how thin the diffusion barrier can be prepared within a reasonable film thickness allowed in the existing semiconductor manufacturing techniques.

To resolve the foregoing problems, it is, therefore, an object of the present invention to provide a nitride semiconductor light emitting device having an n electrode which demonstrates a satisfactory ohmic contact to an n-type nitride semiconductor and unlike in the related art techniques, which does not make the electrode surface rough even after a high-temperature annealing process, and a method of manufacturing the same.

The present invention therefore presents several embodiments of such a device and its manufacturing method in order to obtain satisfactory ohmic contacts to an n-type nitride semiconductor, and some of them are as follows.

1. A nitride semiconductor light emitting device, including: an n-type nitride semiconductor layer provided over a substrate; a light emitting layer provided over the n-type nitride semiconductor layer, for emitting light of a predetermined wavelength; a p-type nitride semiconductor layer provided over the light emitting layer; an n-type ohmic electrode electrically connected to the n-type nitride semiconductor layer; and a p-type ohmic electrode electrically connected to the p-type nitride semiconductor layer, wherein the n-type ohmic electrode is a laminate structure composed of a first layer containing Al as a main ingredient and having a thickness not greater than 10 nm or not less than 3 nm, a second layer containing one or more metals selected from Mo and Nb and suppressing the upward diffusion of Al, a third layer containing one or more metals selected from Ti and Pt and suppressing the downward diffusion of Al, and a fourth layer being made of Au, from the near side of the n-type nitride semiconductor in order of mention.

2. A method of manufacturing a nitride semiconductor light emitting device, the method including the steps of: forming, over a substrate, an n-type nitride semiconductor layer containing at least an n-type impurity; forming, over the n-type nitride semiconductor layer, a light emitting layer for emitting light with a predetermined wavelength; forming, over the light emitting layer, a p-type nitride semiconductor layer containing a p-type impurity; forming, in contact with the p-type nitride semiconductor layer, a p-type ohmic electrode; forming, in contact with the n-type nitride semiconductor, an n-type ohmic electrode having a laminate structure composed of a first layer containing Al as a main ingredient and having a thickness not greater than 10 nm or not less than 3 nm, a second layer containing one or more metals selected from Mo and Nb, a third layer containing one or more metals selected from Ti and Pt, and a fourth layer made of Au, from the bottom in order of mention; and carrying out an annealing process.

By using such an n-type ohmic electrode, satisfactory ohmic contacts to an n-type nitride semiconductor were obtained, and unlike in the related art techniques, diffusion of Al towards the uppermost surface side of the electrode could be well suppressed even after the n-electrode went through a high-temperature annealing process. Consequently, the Au surface on the uppermost side of the electrode stays in good condition without being contaminated by multiple kinds of metals.

Accordingly, the n-type ohmic electrode and the Au-based solder/the Au wire are bonded in practically sufficient junction strength during the device mount process, and this in turn makes it possible to manufacture nitride semiconductor light emitting devices at a high yield.

BRIEF DESCRIPTION OF THE DRAWINGS

FIG. 6 shows I-V characteristics of a sample prepared to verify functions and effects of the present invention;

DETAILED DESCRIPTION OF THE PREFERRED EMBODIMENT

First of all, the following will explain the structure, function and effect of an n-type ohmic electrode in accordance with preferred embodiments of the present invention, on the basis of the experimental results provided by the inventors.

The inventors used Al film thickness of the first layer out of a five-layer laminate structure for an electrode comprising Al/Mo/Ti/Pt/Au as parameter and examined ohmic property of the electrode to an n-type nitride semiconductor and any change in the electrode surface before and after an annealing process.

For the experiment, a low-temperature buffer layer including GaN, an undoped GaN layer with film thickness of 5000 nm, and a Si-doped GaN (doping concentration=1.0~2.0× $10^{18}$ cm$^{-3}$, film thickness=1000 nm) were epitaxially grown on a sapphire substrate by molecular organic chemical vapor deposition (MOCVD).

The ohmic property was evaluated by a conventional transmission line model (TLM) method.

The first layer used as parameter was made of Al in five variable film thicknesses of 5, 10, 30, 50, and 100 nm, and an upper layer of each was provided with four metal layers, i.e., a 50 nm-thick Mo (molybdenum) film as the second layer, a 100 nm-thick Ti (titanium) film as the third layer, a 50 nm-thick Pt (platinum) film as the fourth layer, and a 300 nm-thick Au (gold) film as the fifth layer.

All the layers were adhered and formed by electron beam evaporation, and an electron pattern was formed by a well-known lift-off technique. The thusly formed electrode pattern then went through an annealing process at 500° C. for 10 minutes under nitrogen atmosphere.

The following will now explain about the evaluation result of ohmic property.

Figure 4:
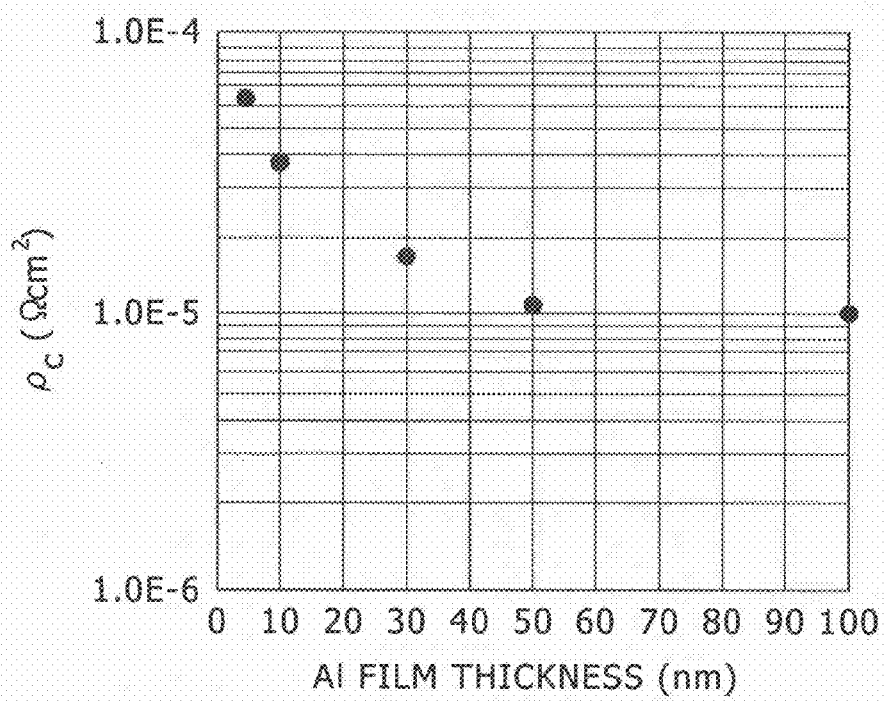
FIG. 4 graphically shows the result of evaluation on the dependence of non-contact resistivity ($\rho_c$) of a sample prepared to verify functions and effects of the present invention upon annealing temperature.

FIG. 4 illustrates the examination results of the dependency of non-contact resistivity ($\rho_c$) upon the thickness of Al film of the first layer, with respect to those five samples, each having a different Al film thickness.

The graph in FIG. 4 shows that $\rho_c$ tends to increase as the thickness of Al film of the first layer gets thinner, but one can notice that $\rho_c$ is also relatively low (i.e., $5.1 \times 10^{-5}$ cm$^2$) even when the Al film is 5 nm in thickness.

As noted earlier, Japanese Patent Application Publication No. 2006-59933 stressed the importance of limiting the thickness of Al film of the first layer to a range of 10 to 70 nm. However, the inventors discovered that satisfactory ohmic properties can still be obtained even when the Al film is as thin as 10 nm or less if Mo is provided to an upper layer of the first Al layer.

This leads one to believe that ohmic properties are determined not only by the thickness of Al film of the first layer, but also by the metal material provided in contact with an upper layer of Al.

Next, the examination result in a change on the electrode surface will be explained. FIG. 5A through FIG. 5E show the observation results of the electrode surface of each sample after an annealing process was performed thereon at 500° C.

Figure 5A:
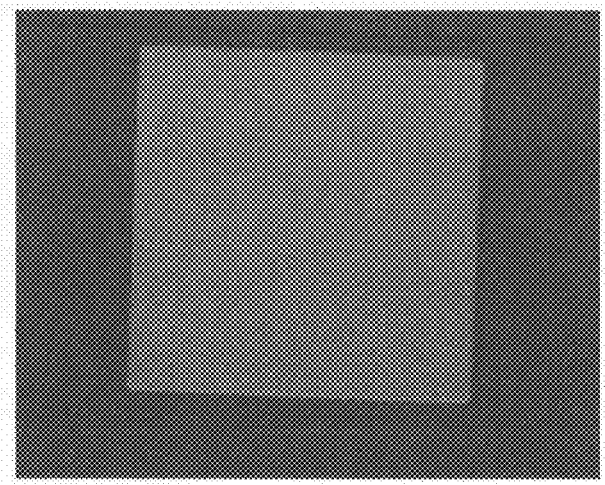
FIG. 5A through FIG. 5E show, respectively, the observation results of the electrode surface of a sample prepared to verify functions and effects of the present invention.
Figure 5B:
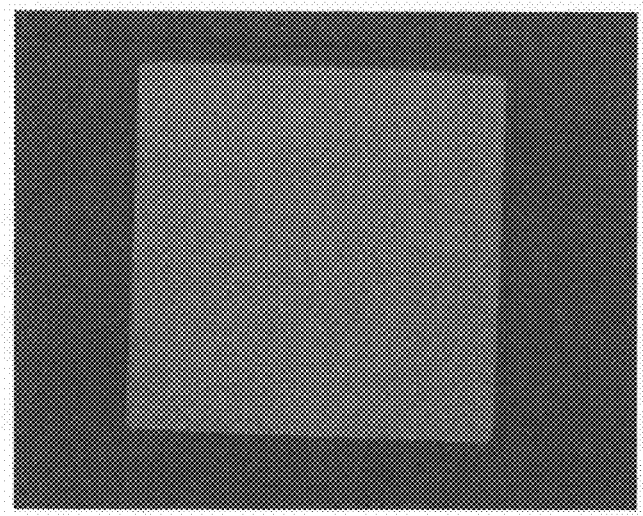
Figure 5C:
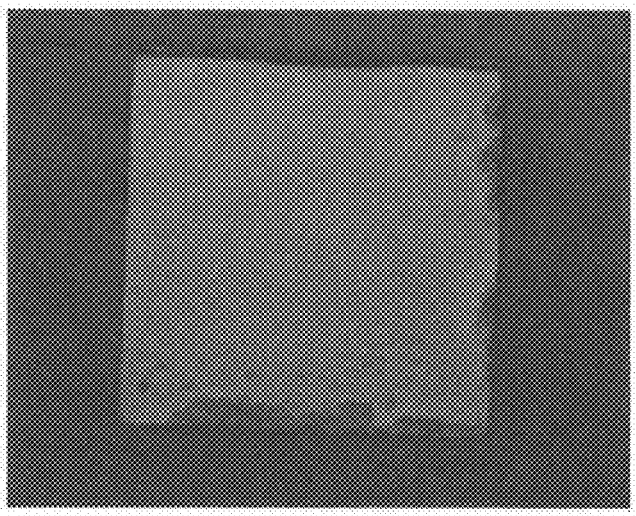
Figure 5D:
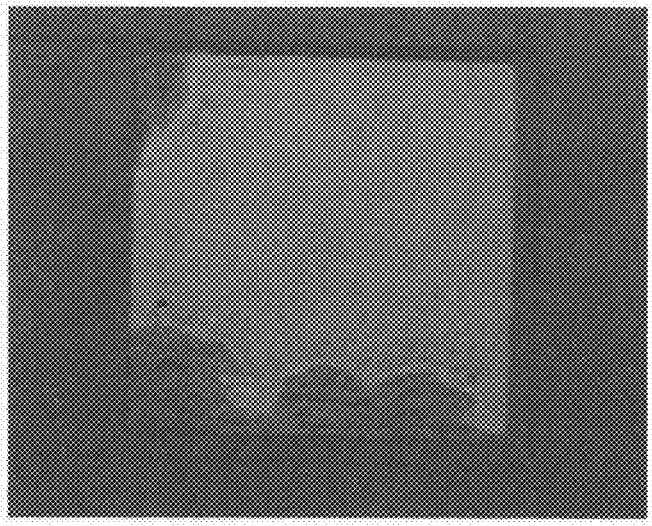
Figure 5E:
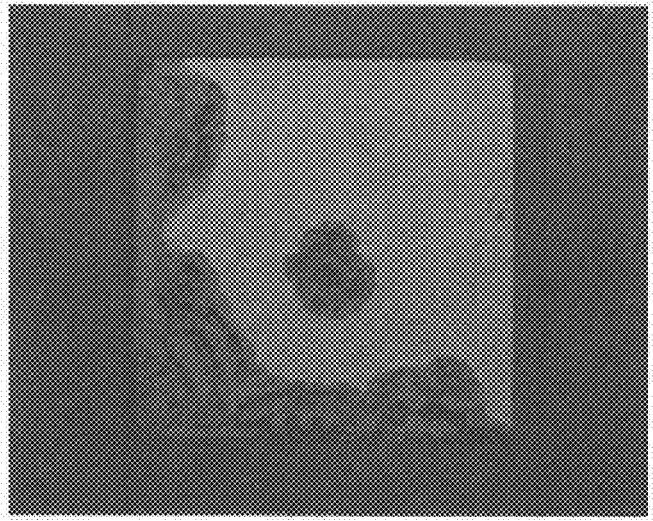

In detail, FIG. 5A presents the observation result of the electrode having a 5 nm-thick Al film, FIG. 5B presents the observation result of the electrode having a 10 nm-thick Al film, FIG. 5C presents the observation result of the electrode having a 30 nm-thick Al film, FIG. 5D presents the observation result of the electrode having a 50 nm-thick Al film, and FIG. 5E presents the observation result of the electrode having a 100 nm-thick Al film (as described in Summary of the Invention).

Figure 3:
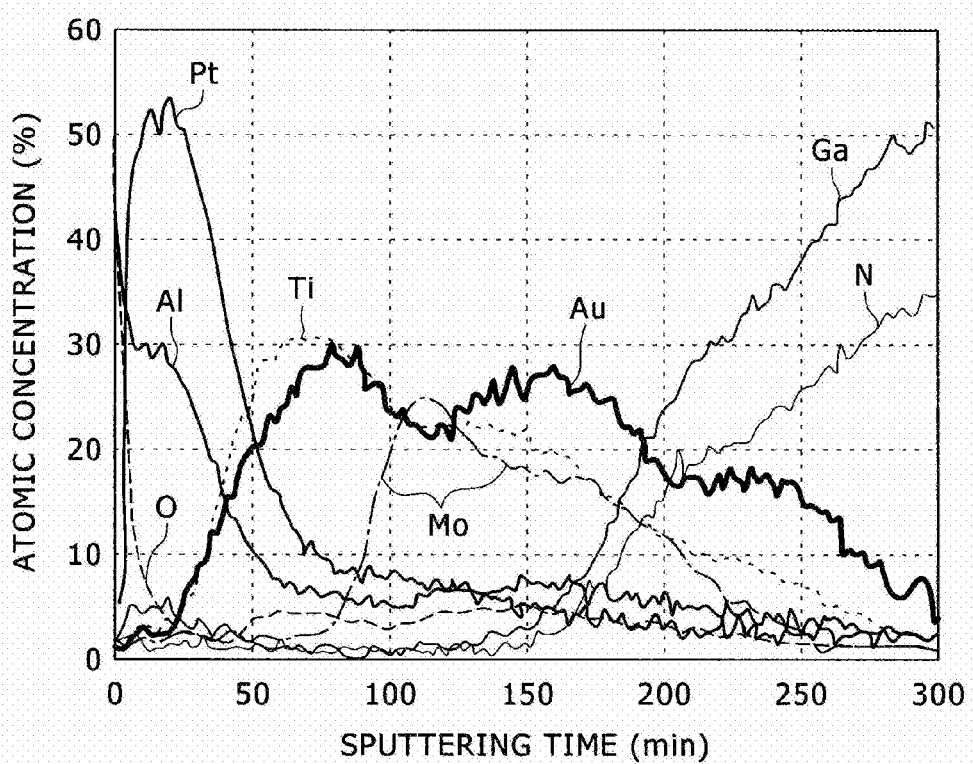
FIG. 3 graphically shows the result of analysis on an rugged or uneven surface of an electrode accompanied by discoloration after annealing at 500° C., the electrode having a laminate structure of Al (film thickness=100 nm)/Mo/Ti/Pt/Au provided based on a related art technique.

Referring to the pictures, the samples having a 5 nm-thick Al film (FIG. 5A) and a 10 nm-thick Al film (FIG. 5B) did not show any change in their electrode surfaces at all, and the entire surface of each exhibited gold (Au) color. In the case of the samples having an Al film with thickness of 30 nm or more (FIGS. 5C through 5E), however, the electrode surface of each suffered severe degradation accompanied by noticeable discoloration and irregularities therein (i.e., uneven surface), and those degraded surface areas tended to get bigger in response to an increase in the Al film thickness. After analyzing the degraded electrode surface areas in depth direction by Auger electron spectroscopy (refer to FIG. 3), the inventors discovered that Al was diffused towards the electrode surface and detected both Al and oxygen thereon. This implies that the uppermost layer of the degraded electrode surface area might be covered with an Al oxide.

The inventors also discovered that the original laminate layer structure for the electrode itself was destroyed by annealing.

Based on the experimental results discussed above, the inventors have learned that the thickness of Al film of the first layer needs to be 10 nm or thinner and that at least Mo should be provided to an upper layer of the Al layer, in order to prevent the degradation on the electrode surface due to the upward diffusion of Al and to realize a satisfactory ohmic contact to an n-type nitride semiconductor.

To obtain even lower contact resistance values within the limited range of the Al film thickness, the inventors provided a thin Ti layer between the n-type nitride semiconductor and the Al layer and conducted the same evaluations as above.

This time, four samples were prepared, each of which having a fixed Al film thickness (i.e., 10 nm) but a different thickness of Ti film (i.e., 0, 2, 5, or 10 nm). The samples were then subjected to an annealing process at 500° C., and I-V characteristics between the same electrode patterns were evaluated (refer to FIG. 6).

As can be seen from FIG. 6, the samples having Ti film thicknesses of 0 nm (Characteristic line #1), 2 nm (Characteristic line #2), and 5 nm (Characteristic line #3) exhibited satisfactory ohmic properties, but the sample having a Ti film thickness of 10 nm (Characteristic line #4) exhibited non-ohmic properties.

Moreover, one can notice that the non-contact resistivity ($\rho_c$) after annealing at 500° C. was about $2.0 \times 10^{-6}$ Ωcm$^2$ in the sample having a 2 nm-thick Ti film, but it was reduced to $\rho_c < 1.0 \times 10^{-6}$ Ωcm$^2$ in the sample having a 5 nm-thick Ti film.

In other words, $\rho_c$ tends to be lower in the sample that is provided with the Ti layer thinner than the Al film between the first Al layer and the n-type nitride semiconductor, compared with the sample that is provided with the Al layer only. Further, $\rho_c$ values seem to be influenced by the thickness of the Ti layer.

Next, in order to check on any change in the electrode layer structure before and after an annealing process at 500° C., the inventors prepared a six-layer laminate structure of an electrode composed of Ti (film thickness=5 nm, which exhibited the lowest resistivity value at the $\rho_c$ evaluation discussed earlier)/Al (film thickness=10 nm)/Mo (film thickness=50 nm)/Ti (film thickness=100 nm)/Pt (film thickness=50 nm)/Au (film thickness=300 nm), and observed the distribution of chemical elements on the cross-section of the electrode by SEM and EDX analysis.

As a result of observation, the boundary of the Ti (film thickness=5 nm)/Al (film thickness=10 nm) laminate disappeared after annealing, while the laminate turned into a single layer film with thickness of about 15 nm instead.

The inventors also checked that Ti and Al were nearly uniformly distributed in areas of the 15 nm-thick single layer.

That is, the originally laminate Ti/Al structure was now alloyed through interdiffusion after annealing, and the alloy layer contributed to lowering the $\rho_c$ value.

Meanwhile, it turned out that Mo provided over the alloy layer neither reacted heavily with metals in the upper and lower layers even during annealing at 500° C., nor was alloyed with other metals. Nevertheless, several areas on the Mo layer exhibited a different color from the Mo layer.

When the areas were analyzed in terms of the distribution of elements, Al was detected. This is probably because Al from the lower layer was diffused into Mo. A possible reason for that phenomenon may be found in the alloying process occurring between Ti and Al after annealing, or the formation of micro open holes in the Mo layer as tension induced by slight interdiffusion between layers is applied to the Mo layer itself.

Therefore, even in the case of a 15 nm-thick Al alloy layer, Al was likely to diffuse towards the electrode surface by annealing, and in the process of discovering possible causes of the change in the electrode layer due to the annealing, one will find it difficult to completely eliminate the upward diffusion of Al.

In order to reduce the probability or possibility of the upward diffusion of Al, it might be necessary to make a metal film of the first layer having Al as a main ingredient even thinner. As an example, to make the Ti—Al inter-reaction layer of the first layer thinner, the thickness of its lower layer Ti was set to 2 nm while the thickness of its upper layer Al was set to 5 nm, and the rest of the laminate structure starting from the second layer adopted the same structure as above. The thus prepared sample was annealed at 500° C. and was evaluated for its ohmic properties. The inventors learned that the non-contact resistivity ($\rho_c$) was $2.3 \times 10^{-6}$ $\Omega cm^2$, which is sufficiently low enough to be applied to nitride semiconductor light emitting devices.

The film thickness of the Ti/Al layer after annealing is expected to be about 7 nm. Particularly when the Ti (film thickness=1 nm)/Al (film thickness=2 nm) was made thinner and then annealed at 500° C., $\rho_c$ itself increased slightly to about $1.0 \times 10^{-5}$ $\Omega cm^2$, but it is low enough to be applied to nitride semiconductor light emitting devices.

By making the first layer thinner, the probability or possibility of the upward diffusion of Al can be reduced further. Preferably, the film thickness of the first layer containing Al as its main ingredient should be around 7 nm. In detail, its lower limit should be 3 nm taking the controllability of the film thickness into consideration and its upper limit should not be greater than 10 nm.

Alternatively, instead of providing Ti underneath the Al film, Hf and Zr, which are homologous elements of Ti, may form the first layer, such as, a lower layer Hf (film thickness=2 nm)/an upper layer Al (film thickness=5 nm), and a lower layer Zr (film thickness=2 nm)/an upper layer Al (film thickness=5 nm). The rest of the laminate structure the rest of the laminate structure starting from the second layer adopted the same structure as above. The thusly prepared two samples were annealed at 500° C. and were evaluated for their ohmic properties. Although there was a little difference in the absolute values of $\rho_c$, both demonstrated sufficiently good ohmic properties and no abnormality was observed on the electrode surface of each sample.

Meanwhile, the inventors prepared a sample having a 7 nm-thick Ti—Al alloy layer as its first layer and having a 50 nm-thick Nb (niobium), not Mo, as its second layer), and conducted the same evaluations. It turned out the same satisfactory results using Nb were obtained as with Mo.

Mo and Nb have certain features in common. That is to say, both melt at a very high temperature around 2500° C. and rarely react with other kinds of metals.

In effect, the first and most important requirement for an upper layer in contact with the Al film in the electrode structure is that it should not easily react with Al. Fortunately, the above experimental results verify that both Mo and Nb qualify as a satisfactory barrier layer.

Figure 9:
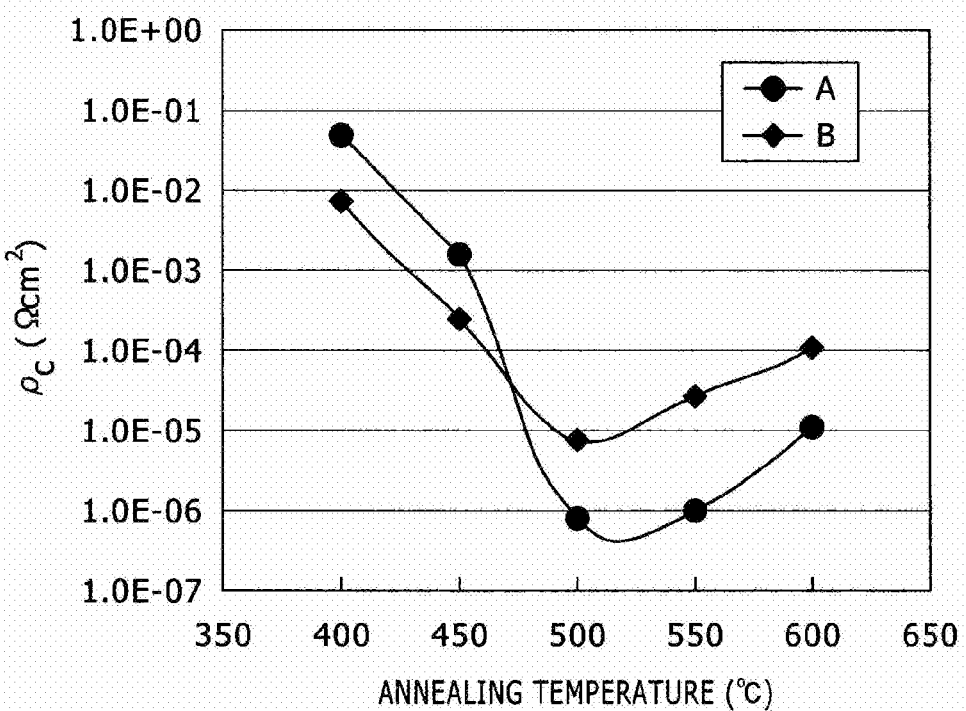
FIG. 9 shows the relationship between non-contact resistivity ($\rho_c$) and annealing temperature.

FIG. 9 illustrates the relationship between anneal temperature and non-contact resistivity ($\rho_c$). Two kinds of samples: A (Ti/Al/Mo/Ti/Pt/Au) and B (Al/Mo/Ti/Pt/Au) exhibited ohmic properties in a temperature range of 450° C. to 600° C., but the resistivity value was lowest at 500° C. This explains why it is effective for annealing the samples at 500° C.

In continuation to the explanations on the structure, function and effect of an n-type ohmic electrode in accordance with the present invention as above, the following will now describe one embodiment of the present invention with reference to accompanying drawings.

Embodiment I

Figure 1:
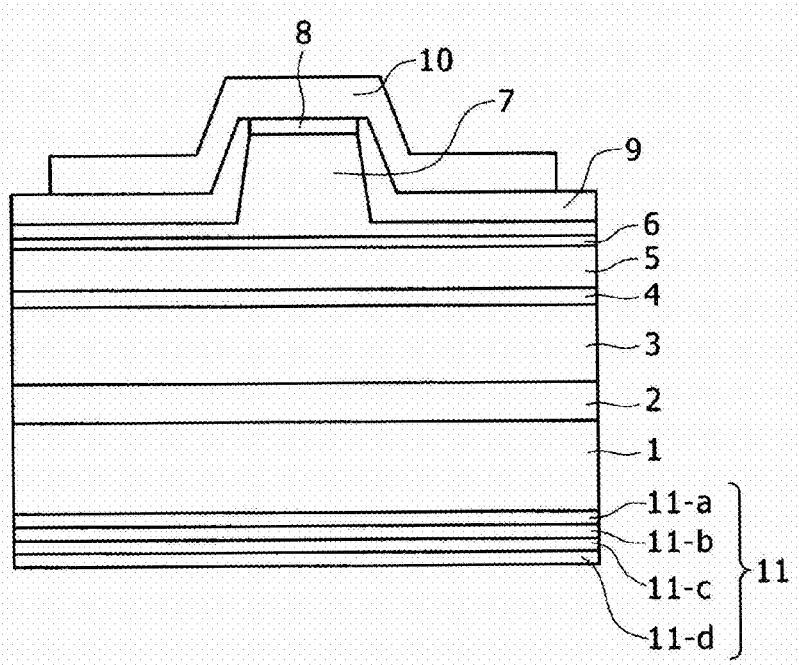
FIG. 1 shows a cross-sectional view of a nitride semiconductor laser device in accordance with a first embodiment of the present invention.
Figure 2:
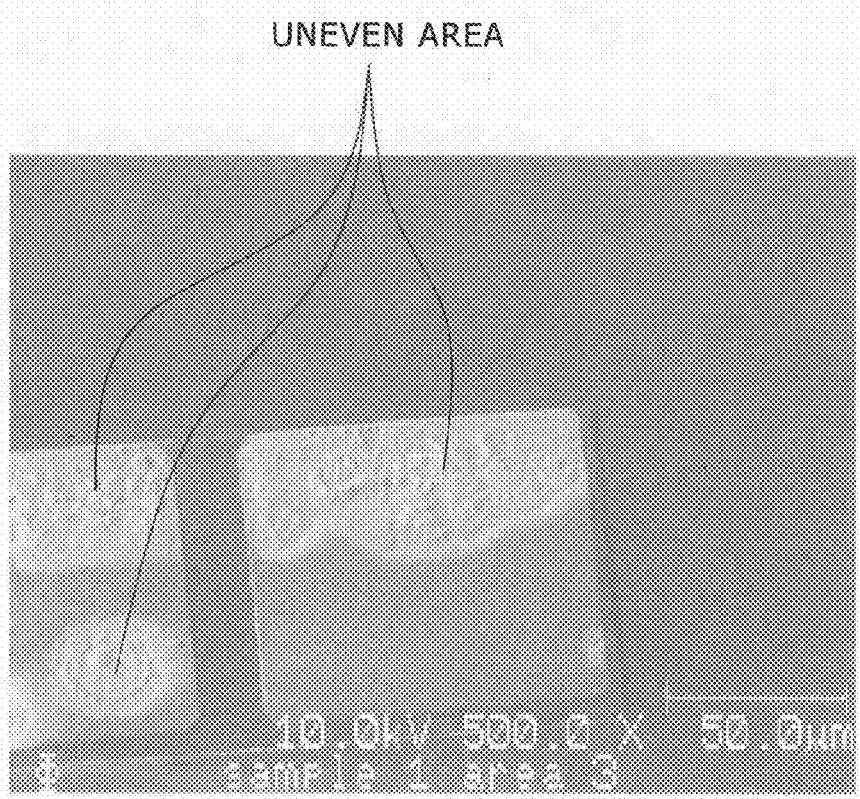
FIG. 2 graphically shows the observation result of the surface of an electrode after annealing at 500° C., the electrode having a laminate structure of Al (film thickness=100 nm)/Mo/Ti/Pt/Au provided based on a related art technique.

FIG. 1 is a schematic cross-sectional view of a nitride semiconductor laser in accordance with one embodiment of the present invention.

Since the gist of the present invention lies in the structure of an n-type ohmic electrode formed in contact with an n-type nitride semiconductor, any of conventional laminate structures is adopted for the structure of epitaxial growth layers of laser, to which the present invention is not limited.

The following will now explain an overall procedure of manufacturing a nitride semiconductor laser.

Referring to FIG. 1, on an n-type GaN substrate 1, an n-type buffer layer 2 made of Si-doped GaN, an n-type clad layer 3 made of Si-doped AlGaN, an n-type guide layer 4 made of Si-doped GaN, an active layer 5 made of InGaN in a multiple quantum well structure, an electronic block layer 6 made of Mg-doped AlGaN (composition ratio of Al is 7%), a p-type clad layer 7 made of Mg-doped AlGaN (composition ratio of Al is 4%), and a p-type contact layer 8 made of Mg-doped GaN were grown sequentially in the order of mention by molecular organic chemical vapor deposition (MOCVD).

Next, a desired area on an opened substrate surface by a resist pattern was etched by a well-known photolithography technique and a drying etching method using a chlorine based gas into the middle of the p-type clad layer 7, to be more specific, to a depth so as to leave 30 to 40 nm of the p-type clad layer 7. Accordingly, a 1.5 µm-wide ridge resonator having the p-type contact layer 8 as a core region is formed.

Next, a $SiO_2$ film 9 with thickness of 250 nm was formed over the front side of the substrate by a well-known insulation film formation method such as CVD or sputtering. Then, a photoresist pattern was formed by photolithography in a manner that only a region at the uppermost portion of the ridge was open. With this photoresist pattern as an etching mask, the open region was etched to expose the p-type contact layer 8 at the core portion of the ridge.

At this time, the etching process is carried out, either by wet etching in use of HF-based solution or by dry etching in use of fluorine-based gas (e.g., $CF_4$ or the like).

After the photoresist pattern was formed in a manner to open a desired region including the open, core portion of the ridge, a Ni (nickel) film and Au were adhered sequentially onto the entire surface side of the substrate 1 by vacuum deposition for example, and unnecessary metal film(s) and the photoresist pattern were removed by a well-known lift-off method. As a result, a p-type ohmic electrode 10 made of Ni/Au is formed over the p-type contact layer 8 at the core portion of the ridge and over the $SiO_2$ film around it.

Next, the n-type GaN substrate 1 was polished and thinned, starting from the rear side of the substrate, by a well-known polishing technique until the substrate has a thickness of about 100 µm.

Next, on the entire rear side of the polished and thinned n-type GaN substrate 1, a 2 nm-thick Ti film, a 5 nm-thick Al film, a 50 nm-thick Mo film, a 100 nm-thick Ti film, a 50 nm-thick Pt film, and a 300 nm-thick Au film were adhered sequentially in the order of mention by electron beam evaporation for example. Finally, the substrate was annealed at 500° C. for 10 minutes under nitrogen atmosphere. In this way, a five-layer n-type ohmic electrode 11 making an ohmic contact to the n-type GaN substrate 1 is formed in a laminate structure composed of Ti—Al (11-a), Mo (11-b), Ti/Pt (11-c), and Au (11-d) in the order of mention from the semiconductor side.

Next, the n-type ohmic electrode 11 was cleaved perpendicularly to the length direction of the ridge to form about 600 µm long bar-shaped resonator cross-sections on both sides, and a single-side coating film 12 having a desired reflectance and transmission factor is formed on both cross-sections.

Figure 7:
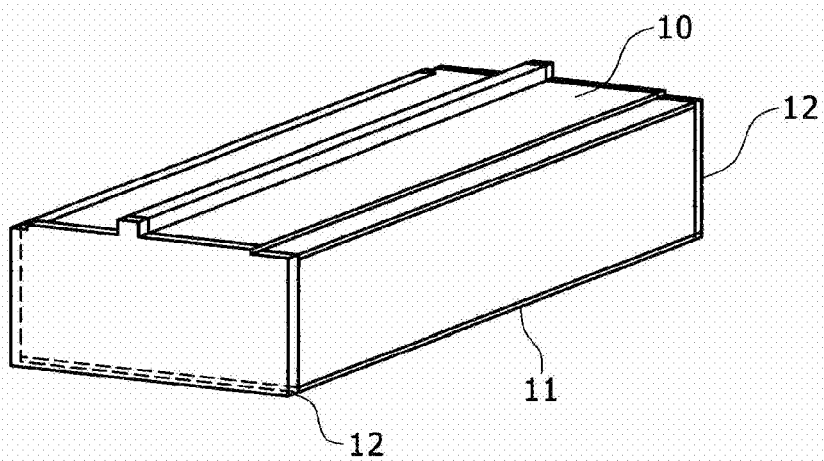
FIG. 7 is a schematic view of a nitride semiconductor laser device in accordance with the first embodiment of the present invention.

Further, the bars were made into a chip by cleavage to complete manufacturing of a nitride semiconductor laser that has the cross-sectional structure of FIG. 1 and the configuration shown in FIG. 7. With the p-type ohmic electrode side of the laser chip as a mount face, the laser chip was mounted, by dye-bonding, on a sub-mount face that is made of SiC coated with a Au—Sn solder, and the sub-mount having the laser chip mounted thereon is mounted further on a stem. Lastly, the p-electrode side of the laser chip facing upward and the electrode side on the sub-mount to which the n-electrode is electrically connected are properly bonded and wired by Au wires, thereby completing the manufacture of a nitride semiconductor laser device.

Then, fifty of nitride semiconductor laser devices were prepared following the manufacturing process described above, and I-V (current-voltage) characteristics of each were evaluated through an external input terminal to which Au wire of each laser is connected. There was no sharp increase in direct resistance or non-uniformity in increasing voltage, and there was no problem observed in electrical conduction by mounting.

Next, adhesion strength of each nitride semiconductor laser device was measured by conducting the shear failure test on the Au—Sn solder adhesive face between the laser chip and the sub-mount. Having tested all of 50 laser devices and having observed the occurrence of separation on the solder metallized face all within a range between 450 g and 650 g, the inventors could come to the conclusion that the n-type ohmic electrode surface and the Au—Sn solder are bonded in sufficient junction strength.

Embodiment 2

Figure 8:
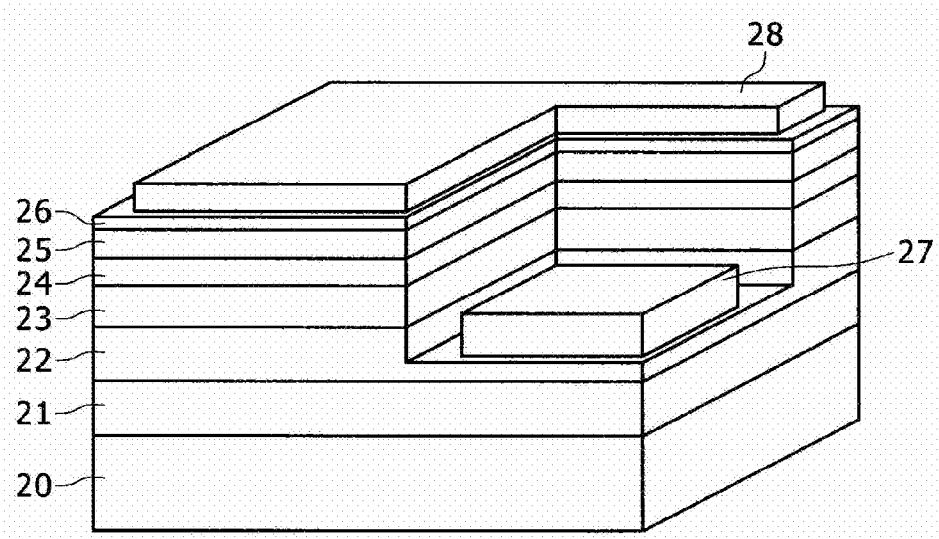
FIG. 8 is a schematic cross-sectional view of a nitride semiconductor light emitting diode in accordance with a second embodiment of the present invention.

FIG. 8 is a schematic view of a nitride semiconductor light emitting diode in accordance with another embodiment of the present invention. An overall manufacturing method thereof will now be explained below.

On a sapphire substrate 20 is formed a multiple-layer structure including a buffer layer 21 made of undoped GaN, a Si-doped n-type GaN layer 22 having carrier concentration of $2\times10^{18}$ cm$^{-3}$ and film thickness of 5 μm, Si-doped n-type AlGaN clad layer 23, an active layer 24 made of In$_b$Ga$_{1-b}$N (0<b≦0.1), a p-type clad layer 25 made of Mg-doped AlGaN having Mg doping concentration of $3.0\times10^{19}$ cm$^{-3}$ and film thickness of 40 nm, and a p-type contact layer 26 made of Mg-doped GaN, the layers being sequentially grown by molecular organic chemical vapor deposition (MOCVD). Next, a desired region was etched, starting from the surface side of the substrate 20, by a well-known photolithography technique and by dry etching using a chlorine based gas, so as to expose the Si-doped n-type GaN layer 22.

Next, the Hf/Al/Nb/Ti/Pt/Au (film thickness=2/5/50/100/50/300 nm) film according to the present invention was adhered, by electron beam evaporation, to a desired position of the exposed Si-doped n-type GaN layer 22, and then annealed at 500° C. under nitrogen atmosphere. In this manner, an n-type ohmic electrode 27, having the five-layer laminate structure of Hf—Al/Nb/Ti/Pt/Au and making an ohmic contact to the Si-doped n-type GaN layer 22, is thus formed.

Next, a p-type ohmic electrode 28 is formed by forming a laminate composed of 30 nm-thick Pd film/70-nm-thick Pt film/300-nm Au film at a desired position on a second p-type clad layer 26 in a non-etched region.

After that, the rear side of the sapphire substrate 20 was made thinner by diamond polishing particles until it becomes as thin as 200 μm, and, as a final process, the polished face was subjected to mirror-like finishing and was made into a chip of desired size, thereby completing the manufacture of a nitride semiconductor LED.

The thusly prepared n-type ohmic electrode 27 and p-type ohmic electrode 28 of the LED were bonded respectively by Au wires and connected to an external input terminal, so as to complete the LED mount process.

No connection defect occurred in the process of wire bonding for 30 LEDs, and the outer appearance of the junction was also satisfactory. As for the forward direction characteristics of LEDs, an average voltage necessary to obtain 50 mA current was 3.2V. Also, there was no sharp increase in voltage and current was obtained for each. In addition, the inventors confirmed that electrical conduction between the n-type ohmic electrode and the Au wire of each LED was satisfactory.

In order to evaluate adhesion between the Au wire and the n-type ohmic electrode surface of each of 30 LEDs, the inventors conducted a pull test on the connected Au wire. It turned out that breaking strength for all the 30 LEDs was in a range of 10 g to 15 g, and all the broken portions, if any, were found along the Au wires. From these results, the inventors came to conclusion that the adhesion or juncture between the n-type ohmic electrode surface and the Au wire is very strong.

Although the embodiments having been explained so far utilized a sapphire substrate as a substrate material, it is needless to say that any substrate material, say, GaN, SiC, Si, or the like can also be used as long as a nitride semiconductor can grow reasonably thereon. Further, a variety of substrate materials may be used, depending on the structure of LED to be manufactured.

Although the embodiments of the present invention have been mainly focused on the manufacturing method of a nitride semiconductor light emitting device, the structure of a specific nitride semiconductor is not limited to those embodiments but can be varied based on the configuration or required function for a device to be manufactured.

By applying the n-type ohmic electrode of the invention to a nitride semiconductor light emitting device, satisfactory ohmic contacts to an n-type nitride semiconductor can be obtained, and the uppermost surface of the electrode even after high-temperature annealing still retains Au suitable for the mount process.

What is claimed is:

1. A nitride semiconductor light emitting device, comprising:
   an n-type nitride semiconductor layer provided over a substrate;
   a light emitting layer provided over the n-type nitride semiconductor layer, for emitting light of a predetermined wavelength;
   a p-type nitride semiconductor layer provided over the light emitting layer;
   an n-type ohmic electrode electrically connected to the n-type nitride semiconductor layer; and
   a p-type ohmic electrode electrically connected to the p-type nitride semiconductor layer,
   wherein the n-type ohmic electrode is a laminate composed of a first layer, a second layer, a third layer, and a fourth layer, from the near side of the n-type nitride semiconductor in order of mention,
   the first layer is a thin film containing Al (aluminum) as a main ingredient and has a thickness not greater than 10 nm and not less than 3 nm,
   the second layer is a thin film containing one or more metals selected from Mo (molybdenum) and Nb (niobium), so as to suppress the upward diffusion of Al,
   the third layer is a thin film containing one or more metals selected from Ti (titanium) and Pt (platinum), so as to suppress the downward diffusion of Al, and
   the fourth layer is made of Au (gold), and
   wherein the first layer is constructed to have a thickness selected to prevent Al diffusion-caused contamination at a surface of said n-type ohmic electrode at said fourth layer.

2. The nitride semiconductor light emitting device according to claim 1, wherein the first layer of the n-type ohmic electrode consists of Al.

3. The nitride semiconductor light emitting device according to claim 1, wherein the first layer of the n-type ohmic electrode contains Ti.

4. The nitride semiconductor light emitting device according to claim 1, wherein the first layer of the n-type ohmic electrode contains Hf (hafnium).

5. The nitride semiconductor light emitting device according to claim 1, wherein the first layer of the n-type ohmic electrode contains Zr (zirconium).

6. The nitride semiconductor light emitting device according to claim 1, wherein the second layer of the n-type ohmic electrode contains Mo, and the third layer of the n-type ohmic electrode contains has a Ti/Pt laminate structure composed of Ti and Pt, from the near side of the n-type semiconductor layer in order.

7. The nitride semiconductor light emitting device according to claim 1, wherein the substrate includes an n-type conductive nitride semiconductor, and the n-type ohmic electrode is formed at the surface side of the n-type nitride semiconductor layer provided over the n-type conductive substrate, or formed in contact with the rear side, opposite to the surface, of the n-type conductive substrate.

8. The nitride semiconductor light emitting device according to claim 1, wherein the substrate includes a non-conductive substrate, and the n-type ohmic electrode is provided in contact with the surface side of the n-type nitride semiconductor layer.

9. The nitride semiconductor light emitting device according to claim 1, wherein the nitride semiconductor light emitting device is a light emitting diode (LED).

10. The nitride semiconductor light emitting device according to claim 1, wherein the nitride semiconductor light emitting device is a laser diode (LD).

11. A nitride semiconductor light emitting device, comprising:
an n-type nitride semiconductor layer provided over a substrate;
a light emitting layer provided over the n-type nitride semiconductor layer, for emitting light of a predetermined wavelength;
a p-type nitride semiconductor layer provided over the light emitting layer;
an n-type ohmic electrode electrically connected to the n-type nitride semiconductor layer; and
a p-type ohmic electrode electrically connected to the p-type nitride semiconductor layer,
wherein the n-type ohmic electrode is a laminate composed of a first layer, a second layer, a third layer, and a fourth layer, from the near side of the n-type nitride semiconductor in order of mention,
the first layer is a thin film containing Al (aluminum) as a main ingredient and has a thickness not greater than 10 nm and not less than 3 nm,
the second layer is a thin film containing one or more metals selected from Mo (molybdenum) and Nb (niobium), so as to suppress the upward diffusion of Al,
the third layer is a thin film containing one or more metals selected from Ti (titanium) and Pt (platinum), so as to suppress the downward diffusion of Al, and
the fourth layer is made of Au (gold), and
wherein the n-type ohmic electrode has a non-contact resistivity of less than or equal to $1.0 \times 10^{-5}$ $\Omega cm^2$.

12. The nitride semiconductor light emitting device according to claim 11, wherein the n-type ohmic electrode has a non-contact resistivity of less than or equal to $2.3 \times 10^{-6}$ $\Omega cm^2$.

13. The nitride semiconductor light emitting device according to claim 11, wherein the first layer of the n-type ohmic electrode consists of Al.

14. The nitride semiconductor light emitting device according to claim 11, wherein the first layer of the n-type ohmic electrode contains one of Ti, Hf (hafnium), and Zr (zirconium).

15. The nitride semiconductor light emitting device according to claim 11, wherein the second layer of the n-type ohmic electrode contains Mo, and the third layer of the n-type ohmic electrode contains has a Ti/Pt laminate structure composed of Ti and Pt, from the near side of the n-type semiconductor layer in order.

16. The nitride semiconductor light emitting device according to claim 11, wherein the substrate includes an n-type conductive nitride semiconductor, and the n-type ohmic electrode is formed at the surface side of the n-type nitride semiconductor layer provided over the n-type conductive substrate, or formed in contact with the rear side, opposite to the surface, of the n-type conductive substrate.

17. The nitride semiconductor light emitting device according to claim 11, wherein the substrate includes a non-conductive substrate, and the n-type ohmic electrode is provided in contact with the surface side of the n-type nitride semiconductor layer.

18. The nitride semiconductor light emitting device according to claim 11, wherein the nitride semiconductor light emitting device is a light emitting diode (LED).

* * * * *